United States Patent
Lee et al.

(10) Patent No.: US 8,748,791 B2
(45) Date of Patent: Jun. 10, 2014

(54) IMAGE SENSOR

(75) Inventors: Hee Bum Lee, Icheon-si (KR); Tae Woo Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 350 days.

(21) Appl. No.: 13/198,002

(22) Filed: Aug. 4, 2011

(65) Prior Publication Data

US 2012/0037791 A1   Feb. 16, 2012

(30) Foreign Application Priority Data

Aug. 13, 2010   (KR) .................. 10-2010-0078376

(51) Int. Cl.
*H01J 40/14* (2006.01)
(52) U.S. Cl.
USPC ............. 250/208.1; 250/214 R; 250/214 SW; 250/214 P; 327/131; 323/288
(58) Field of Classification Search
USPC ............. 250/208.1, 214 R, 214 LS, 214 SW, 250/214 P; 327/131, 136, 137, 140; 323/271, 282, 288
See application file for complete search history.

(56) References Cited

U.S. PATENT DOCUMENTS

| | | | |
|---|---|---|---|
| 7,498,792 B2 * | 3/2009 | Chang et al. | 323/288 |
| 2011/0260708 A1 * | 10/2011 | Trifonov et al. | 323/313 |

FOREIGN PATENT DOCUMENTS

| | | | |
|---|---|---|---|
| KR | 1020060077179 A | | 7/2006 |
| KR | 1020090069803 A | | 7/2009 |

* cited by examiner

*Primary Examiner* — Kevin Pyo
(74) *Attorney, Agent, or Firm* — William Park & Associates Patent Ltd.

(57) ABSTRACT

An image sensor includes a band gap reference unit configured to provide a reference voltage having a predetermined voltage level, a storage unit configured to store the reference voltage, a switch configured to selectively connect the storage unit to the band gap reference unit, and a ramp signal generation unit configured to receive an input voltage corresponding to the reference voltage stored in the storage unit and generate a ramp signal.

15 Claims, 5 Drawing Sheets

// IMAGE SENSOR

CROSS-REFERENCE(S) TO RELATED APPLICATIONS

The present application claims priority of Korean Patent Application No. 10-2010-0078376 on Aug. 13, 2010, which is incorporated herein by reference in its entirety.

BACKGROUND OF THE INVENTION

Exemplary embodiments of the present invention relate to an integrated circuit, and more particularly, to an image sensor.

In general, an image sensor refers to a device which captures an image by using semiconductor properties that respond to light. A chare coupled device (CCD) image sensor has been widely used. However, as complementary metal oxide semiconductor (CMOS) technology has made rapid progress, an image sensor using CMOS has been developed. As compared to a conventional CCD image sensor, a CMOS image sensor has an advantage in that analog circuits including a pixel array and digital control circuits can be directly implemented on a single integrated circuit (IC).

An image sensor has as many comparators as the number of columns of a pixel array. Since the comparator is a circuit requisite to convert a pixel signal into a digital signal, it gives great influence on a quality of an output image. The comparator receives a ramp signal and a data signal, i.e., pixel signal related to an image provided from a pixel. The ramp signal gradually decreases at a constant rate. The comparator compares the data signal with the ramp signal to output a value to be stored as an image. Therefore, it is important to generate a reliable ramp signal from an internal ramp signal generation circuit so that an image sensor can store a reliable image.

SUMMARY OF THE INVENTION

An embodiment of the present invention is directed to an image sensor including an improved ramp signal generation circuit.

In accordance with an embodiment of the present invention, an image sensor includes a band gap reference unit configured to provide a reference voltage having a predetermined voltage level, a storage unit configured to store the reference voltage, a switch configured to selectively connect the storage unit to the band gap reference unit, and a ramp signal generation unit configured to receive an input voltage corresponding to the reference voltage stored in the storage unit and generate a ramp signal.

In accordance with another embodiment of the present invention, a method for operating an image sensor, which includes a storage unit configured to store a reference voltage, a switch configured to transfer the reference voltage to the storage unit, and a ramp signal generation unit configured to generate a ramp signal using the reference voltage, includes storing the reference voltage having a predetermined voltage level in the storage unit through the switch, turning off the switch so that the storage unit is disconnected from a transfer node to which the reference voltage is provided, and generating the ramp signal using an input voltage corresponding to the reference voltage stored in the storage unit.

In accordance with another embodiment of the present invention, ramp signal generation circuit comprises a switch enabled to receive a reference voltage, a voltage storage unit enabled to store the reference voltage via the switch, an amplifier unit enabled to amplify the stored reference voltage, and an integrator enabled to generate a ramp signal by integrating an output of the amplifier unit.

DESCRIPTION OF SPECIFIC EMBODIMENTS

Figure 1:
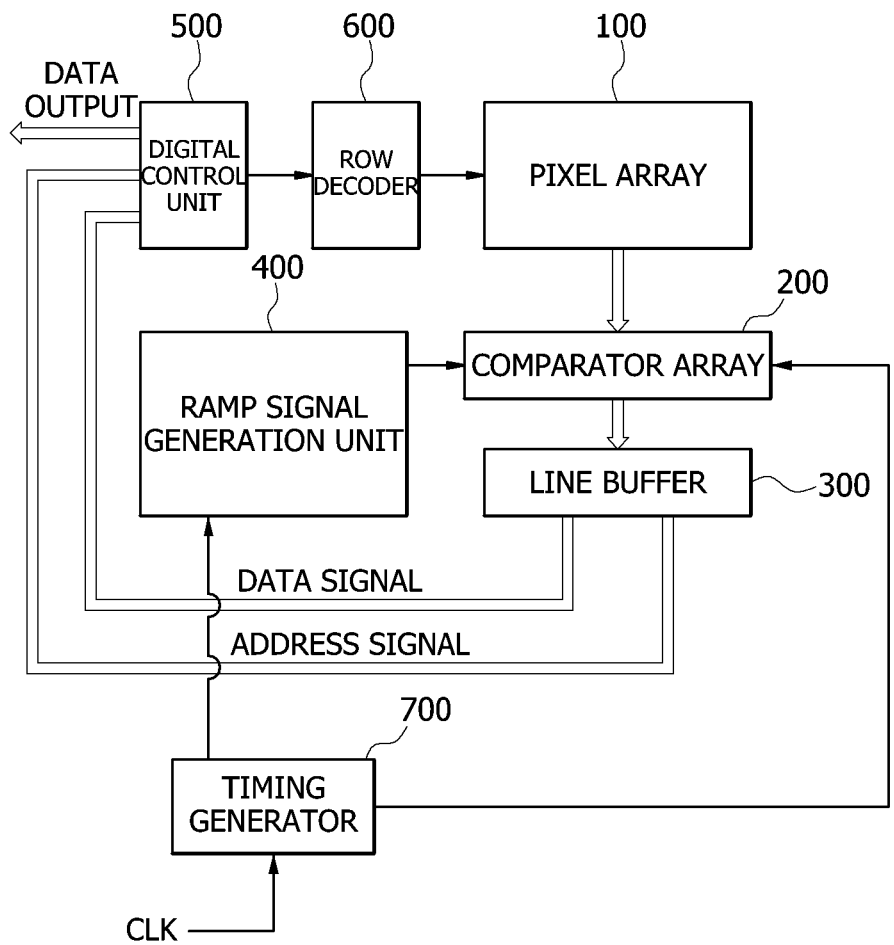
FIG. 1 is a block diagram illustrating an overall configuration of an image sensor that may be used with an embodiment of the invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an overall configuration of an image sensor that may be used with an embodiment of the invention, and is presented for explaining the present invention.

Referring to FIG. 1, a CMOS image sensor includes a pixel array 100, a comparator array 200, a line buffer 300, a ramp signal generation unit 400, a digital control unit 500, a row decoder 600, and a timing generator 700. The pixel array 100 includes a plurality of unit pixels arranged therein. The comparator array 200 includes a plurality of comparators arranged therein to compare an analog output voltage outputted from the pixel array 100 with a ramp signal in order to convert a pixel signal into a digital value. The line buffer 300 includes a latch array which stores a digital signal corresponding to an output signal of the comparator array 200. The ramp signal generation unit 400 generates the ramp signal and outputs the ramp signal to the comparator array 200. The digital control unit 500 generates a control signal for the above-described blocks. The row decoder 600 selects a specific row of the pixel array 100 in response to the control signal outputted from the digital control unit 500.

The comparator array 200 includes as many comparators as the number of columns of the pixel array 100. The respective comparators convert analog pixel values of columns into digital codes. The converted digital signals are stored in the line buffers 300 that correspond to the columns of the pixel array 100. The digital pixel signals stored in the line buffers 300 are image-processed by the digital control unit 500 and then outputted in sequence. The ramp signal generation unit 400 generates the ramp signal and provides the ramp signal to the comparators included in the comparator array 200.

The timing generator 700 receives a clock signal CLK and generates a control signal required for the operation of the blocks inside the image sensor. For example, the timing generator 700 provides the ramp signal generation unit 400 with the control signal for generating the ramp signal so that the ramp signal generation unit 400 can output the ramp signal at a predefined time.

Figure 2:
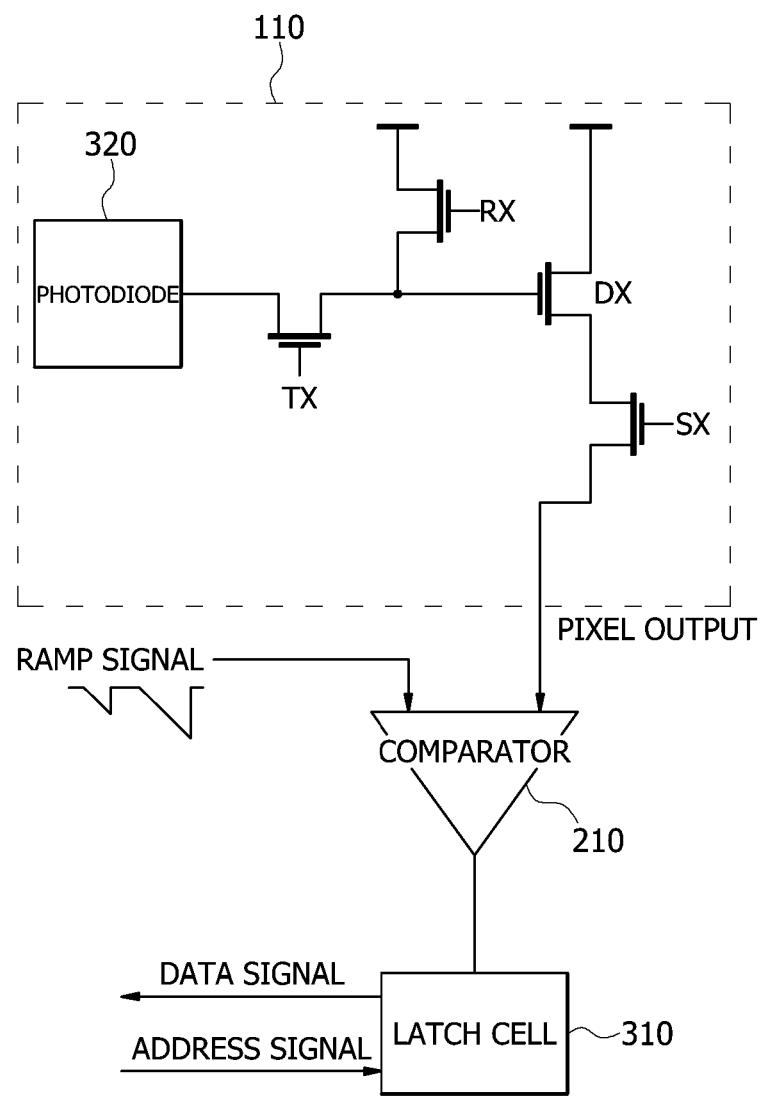
FIG. 2 schematically illustrates a procedure of converting an output signal of a unit pixel into a digital signal and storing the digital signal in blocks of the image sensor of FIG. 1.

FIG. 2 schematically illustrates a procedure of converting an output signal of a unit pixel into a digital signal and storing the digital signal in the blocks of the image sensor of FIG. 1. A unit pixel 110 is one of the plurality of pixels provided in the pixel array 100, and a comparator 210 is one of the plurality of comparators provided in the comparator array 200. A latch cell 310 is one of a plurality of latch cells provided in the line buffer 300.

The unit pixel 110 includes a photodiode 320, a transfer transistor Tx, a drive transistor Dx, a reset transistor Rx, and a select transistor Sx. The photodiode 320 accumulates an amount of charges corresponding to incident light. The transfer transistor Tx transfers the charges accumulated in the photodiode 320. The drive transistor Dx acts as a source follower. The drive transistor Dx receives at its gate a voltage corresponding to the charges from the photodiode 320. The charge at the gate of the drive transistor Dx controls current flow in the drive transistor Dx. The reset transistor Rx applies a reset voltage to a gate of the drive transistor Dx. The select transistor Sx provides the comparator 210 with the current transferred from the drive transistor Dx. The current provided to the comparator 210 is an input signal of the comparator 210.

The comparator 210 compares the ramp signal with the output signal of the unit pixel. The latch cell 310 stores a digital value corresponding to the output signal of the comparator 210 and outputs the digital value in response to an address signal.

Figure 3:
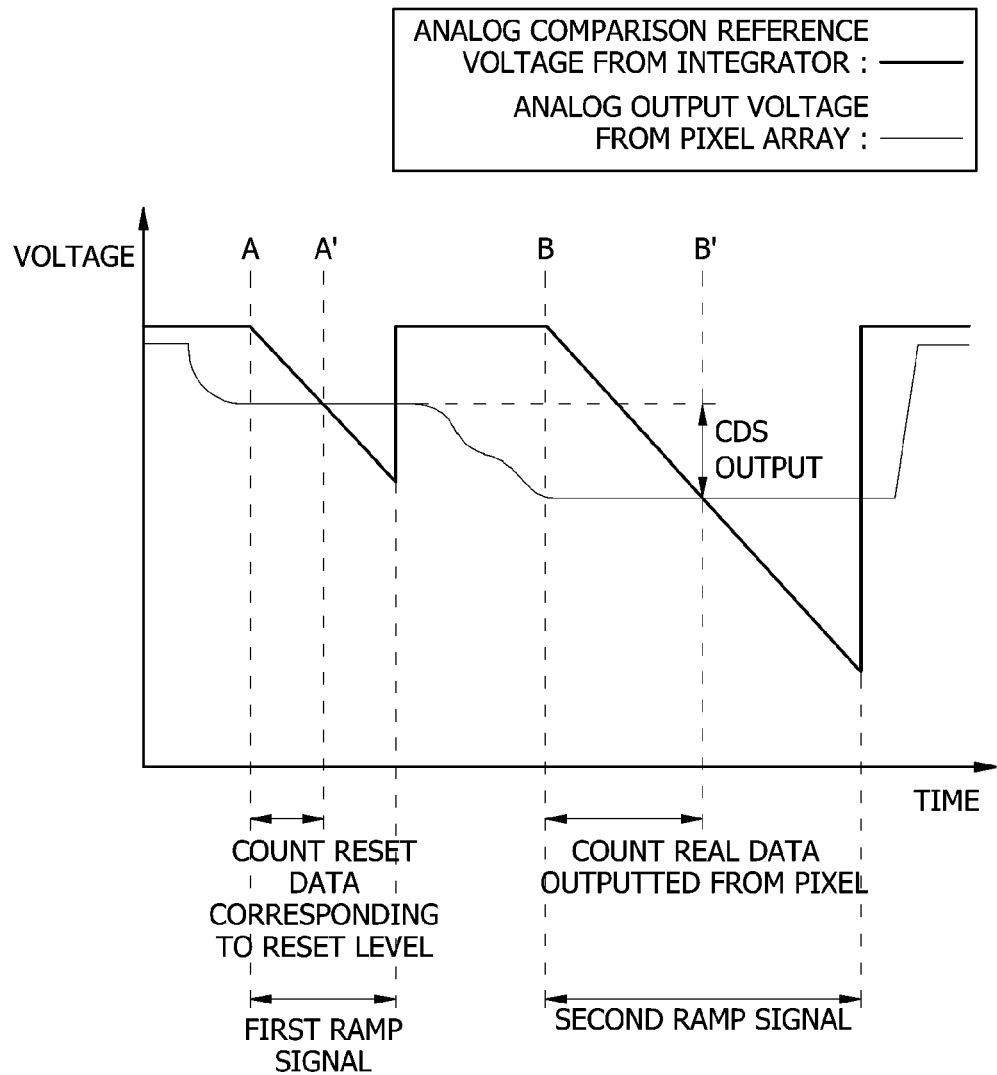
FIG. 3 is a waveform diagram illustrating the comparison result obtained when a ramp signal is compared with a pixel voltage by using digital double sampling in a comparator of an image sensor.

FIG. 3 is a waveform diagram illustrating the comparison result obtained when the ramp signal is compared with the pixel voltage by using digital double sampling in the comparator of the image sensor.

The reset transistor Rx of the unit pixel 110 is turned on, and the reset voltage at the gate of the transfer transistor Tx then turns off the transfer transistor Tx. At this time, the select transistor Sx is turned on. Thus, a signal corresponding to a reset level is inputted to a positive (+) input terminal of the comparator 210, and a first ramp signal is inputted to a negative (−) input terminal of the comparator 210. The two inputted signals are continuously compared by the comparator 210. A digital code corresponding to the ramp signal is recorded in the latch cell 310 until the voltage of the ramp signal becomes lower than the voltage of the signal corresponding to the reset level, which is inputted to the positive (+) input terminal of the comparator 210. The ramp signal is a signal that decreases at a constant rate. When the first ramp signal is outputted, a counter (not shown) begins to count a clock. A digital value counted until the output signal of the comparator 210 is outputted. The outputted digital value is stored as a first digital value in the corresponding latch cell 310. That is, the counting begins at a point A of FIG. 3, and a value counted until a point A' is stored in the latch cell 310.

Subsequently, when the reset transistor Rx of the unit pixel 110 is turned off and the transfer transistor Tx and the select transistor Sx of the unit pixel 110 are turned on, the photodiode 320 accumulates charges according to intensity of external light. A signal corresponding to the charges accumulated in the photodiode 320 is inputted to the positive (+) input terminal of the comparator 210. A second ramp signal is inputted to the negative (−) input terminal of the comparator 210, and the comparator 210 compares the two inputted signals. When the voltage of the ramp signal is lower than the input voltage provided from the unit pixel to the positive (+) input terminal of the comparator 210, a digital value counted until the output signal of the comparator 210 is outputted. The outputted digital value is stored as a second digital value in the latch cell 310. That is, the counter begins to count from a point B to a point B', at which time the output signal of the comparator 210 is outputted.

A final image value outputted from the image sensor is a difference of the two stored digital values. In this manner, it is possible to eliminate an offset (for example, an offset the comparator or the like may have) which may occur due to a process error of the pixel array or during a procedure of converting an analog value into a digital value. In addition, the first ramp signal illustrated in FIG. 3 is a signal for obtaining a digital value which coincides with an output voltage of each unit pixel when the unit pixel is reset, and the second ramp signal is a signal for obtaining a digital value corresponding to a data signal provided from each unit pixel.

As described above, the ramp signal in the image sensor is a very important waveform in order to ensure the reliability of operation. Hence, the operation characteristic of the ramp signal generation circuit outputting the ramp signal has great influence on the operation characteristic of the CMOS image sensor.

The ramp signal generation circuit is designed to receive a reference voltage and generate a ramp signal. However, the ramp signal generation circuit is directly influenced by ground noise. Therefore, the present invention proposes a ramp signal generation circuit in which the reference voltage is less influenced by ground noise.

Based on the fact that the ramp signal generation circuit is directly influenced by ground noise, the noise problem can be reduced by replacing the reference voltage of the ramp signal generation circuit with the voltage stored in a capacitor connected to an external ground only when the ramp signal generation circuit operates.

Figure 4:
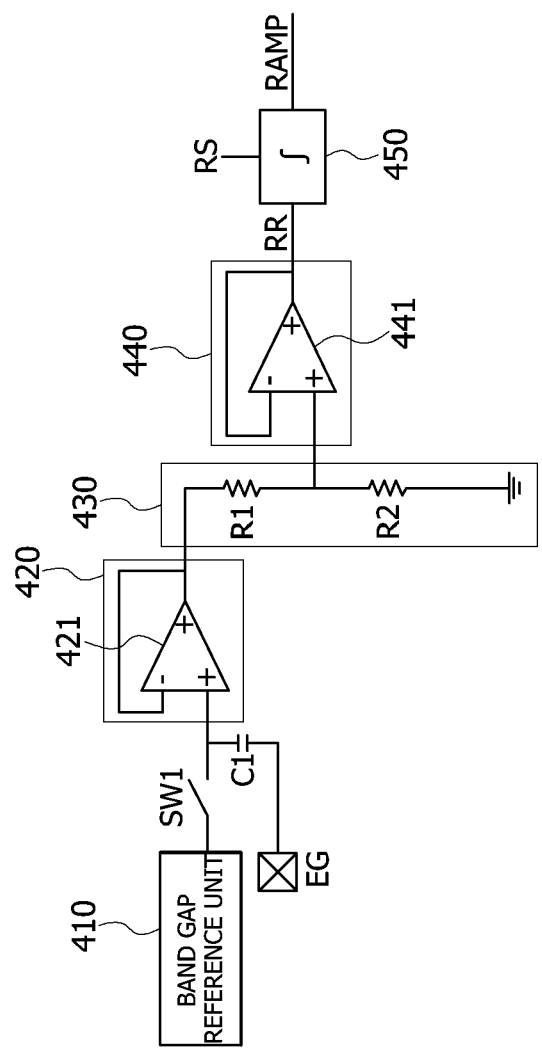
FIG. 4 is a block diagram illustrating exemplary ramp signal generation circuit in accordance with an embodiment of the present invention.

FIG. 4 is a block diagram illustrating a ramp signal generation circuit in accordance with an embodiment of the present invention.

Referring to FIG. 4, the ramp signal generation circuit in accordance with the embodiment of the present invention includes a band gap reference unit 410, a first amplification unit 420, a dividing unit 430, a second amplification unit 440, an integrator 450, a pad EG, a capacitor C1, and a switch SW1.

The band gap reference unit 410 generates a reference voltage having a predefined level. The first amplification unit 420 includes an operational amplifier 421 having an output terminal connected to a negative (−) input terminal thereof, and a positive (+) input terminal connected between the switch SW1 and the capacitor C1. The dividing unit 430 includes resistors R1 and R2 connected in series. The second amplification unit 440 includes an operational amplifier 441 having a positive (+) terminal connected to a connection node between the resistor R1 and the resistor R2. The integrator 450 outputs a ramp signal RAMP by integrating an output signal RR of the second amplification unit 440 in response to a control signal RS which controls the output of the ramp signal RAMP. The capacitor C1 is disposed between the pad EG connected to the external ground and the positive (+) terminal of the operational amplifier 421.

The switch SW1 is switched between the band gap reference unit 410 and the positive (+) input terminal of the operational amplifier 421. The switch SW1 may be implemented using a MOS transistor. In addition, the turn-on and turn-off operations of the switch SW1 are controlled by the switch control signal generated from the timing generator 700 of FIG. 1. The first amplification unit 420, the dividing unit 430, and the second amplification unit 440 are provided to output a ramp ready signal RR. In addition, the control signal RS may be used as a signal for controlling the switch SW1. The first amplification unit 420 and the second amplification unit 440 act as buffers. The first amplification unit 420 and the second amplification unit 440 may be implemented with other circuits which act as buffers.

The ramp signal generation unit in accordance with the embodiment of the present invention is characterized in that the switch SW1 is provided between the output of the band gap reference unit 410 and the first amplification unit 420, and the capacitor C1 is disposed between the pad EG connected to the external ground and the positive (+) input terminal of the operational amplifier 421. In the conventional art, the ramp ready signal RR is generated using the output voltage of the band gap reference unit 410, and the integrator 450 uses the ramp ready signal RR to generate the ramp signal according to the control signal RS.

However, the ramp signal generation circuit in accordance with the embodiment of the present invention uses the switch SW1 to discriminate a time at which the band gap reference unit 410 generates a reference voltage from a time at which the integrator 450 operates. That is, the switch SW1 is connected when the integrator 450 does not operate, and is then disconnected before the integrator 450 begins to operate. The capacitor C1 stores the reference voltage provided from the band gap reference unit 410 while the integrator 450 operates.

Since the switch SW1 is disconnected when the integrator 450 is operating, the reference voltage stored in the capacitor C1 is outputted to the first amplification unit 420. Therefore, even though noise components are introduced while the band gap reference unit 410 generates the reference voltage, influence caused by noise introduced from the band gap reference unit 410 can be reduced when the integrator 450 outputs the ramp signal RAMP.

Figure 5:
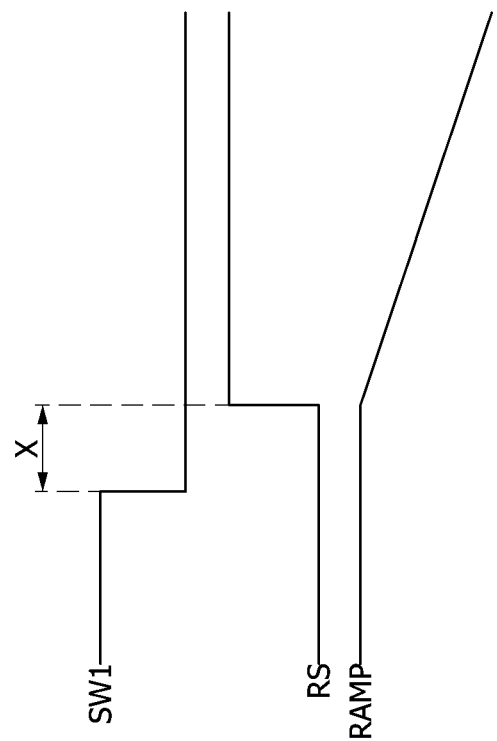
FIG. 5 is a waveform diagram illustrating the operation of the exemplary ramp signal generation circuit of FIG. 4.

FIG. 5 is a waveform diagram illustrating the operation of the ramp signal generation circuit of FIG. 4.

Referring to FIG. 5, the control signal RS is activated after the switch SW1 is disabled to a low level. Thus, the ramp signal RAMP is not outputted. A gap X from a time point when the switch SW1 is disabled to a low level to a time point when the ramp signal RAMP is activated is determined considering a time until the ramp ready signal RR is outputted from the second amplification unit 440 by the level stored in the capacitor C1 and a time until noise components are eliminated from the input terminal of the first amplification unit 420. The gap X may be, for example, sum of the times related to the ramp ready signal RR outputted from the second amplification unit 440 and the settling of noise at the input terminal of the first amplification unit 420. When the switch SW1 is turned off, the timing generator 700 generates the control signal RS after the above-described time. For example, when the switch SW1 is turned off, the timing generator 700 may generate the control signal RS after 10 clocks of the clock signal CLK.

As described above, since the switch SW1 is provided between the output of the band gap reference unit 410 and the first amplification unit 420, and the capacitor C1 is provided between the pad EG connected to the external ground and the positive (+) input terminal of the operational amplifier 421, the ramp signal generation circuit can generate the ramp signal without being influenced by noise introduced into the band gap reference unit 410.

In accordance with the embodiments of the present invention, since the image sensor is provided with the ramp signal generation circuit which generates the ramp signal, without being influenced by noise, the reliability of operation can be improved.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
a band gap reference unit configured to provide a reference voltage having a predetermined voltage level;
a storage unit configured to store the reference voltage;
a switch configured to selectively connect the storage unit to the band gap reference unit; and
a ramp signal generation unit configured to receive an input voltage corresponding to the reference voltage stored in the storage unit and generate a ramp signal,
wherein the ramp signal is generated after the switch disconnects the storage unit from the band gap reference unit, and
wherein a period of time from disconnecting the storage unit to generating the ramp signal takes into account a time to settle noise at the storage unit.

2. The image sensor of claim 1, wherein a period of time from disconnecting the storage unit to generating the ramp signal takes into account a propagation time from a signal at the storage unit to the ramp generation circuit receiving the input voltage corresponding to the reference voltage.

3. The image sensor of claim 1, wherein the storage unit comprises a capacitor having one terminal connected to a ground voltage and another terminal connected to the switch.

4. The image sensor of claim 3, wherein the ground voltage is connected to an external ground of an integrated circuit chip in which the image sensor is implemented.

5. The image sensor of claim 1, wherein the ramp signal generation unit comprises:
a ramp signal preparing unit configured to receive the reference voltage and generate a ramp ready signal; and
an integrator configured to generate a ramp signal by integrating the ramp ready signal in response to a control signal.

6. The image sensor of claim 5, wherein the ramp signal preparing unit comprises:
a first amplification unit configured to receive and amplify the reference voltage;
a dividing unit configured to divide an output of the first amplification unit; and
a second amplification unit configured to amplify a division voltage outputted from the dividing unit and provide the amplified division voltage as the ramp ready signal.

7. The image sensor of claim 5, wherein the switch is controlled using the control signal.

8. A method for operating an image sensor, which includes a storage unit configured to store a reference voltage, a switch configured to transfer the reference voltage to the storage unit, and a ramp signal generation unit configured to generate a ramp signal using the reference voltage, the method comprising:
storing the reference voltage, having a predetermined voltage level in the storage unit, through the switch;
turning off the switch so that the storage unit is disconnected from a transfer node to which the reference voltage is provided; and generating the ramp signal using an input voltage corresponding to the reference voltage stored in the storage unit,
wherein a period of time from turning off the switch to generating the ramp signal takes into account a time to settle noise at the storage unit.

9. The method of claim 8, wherein the generating of the ramp signal comprises:
amplifying the reference voltage;
dividing the amplified reference voltage at a predetermined voltage ratio;
amplifying the divided voltage; and
generating the ramp signal by integrating the amplified divided voltage.

10. The method of claim 8, wherein a control signal enables generation of the ramp signal a predetermined time after turning off the switch.

11. The method of claim 8, wherein a control signal enables generation of the ramp signal and controls the switch.

12. The method of claim 8, wherein a period of time from turning off the switch to generating the ramp signal takes into account a propagation time from a signal at the storage unit to the ramp generation circuit receiving the input voltage corresponding to the reference voltage.

13. A ramp signal generation circuit comprising:
a switch enabled to receive a reference voltage;
a voltage storage unit enabled to store the reference voltage via the switch;
an amplifier unit enabled to amplify the stored reference voltage; and
an integrator enabled to generate a ramp signal by integrating an output of the amplifier unit,
wherein the switch is turned off to disconnect the storage unit from the reference voltage prior to the integrator being enabled to generate the ramp signal, and
wherein a period of time from disconnecting the storage unit to generating the ramp signal takes into account a time to settle noise at the storage unit.

14. The ramp signal generation circuit of claim 13, wherein the amplifier unit comprises:
a first amplifier amplifying the stored reference voltage;
a voltage divider dividing an output of the first amplifier; and
a second amplifier amplifying an output of the voltage divider.

15. The ramp signal generation circuit of claim 13, wherein a period of time from disconnecting the storage unit to generating the ramp signal takes into account a propagation time from the stored reference signal at the storage unit to the ramp generation circuit receiving the output of the amplifier unit.

* * * * *